United States Patent [19]
Voss et al.

[11] Patent Number: 5,040,152
[45] Date of Patent: Aug. 13, 1991

[54] FAST STATIC RANDOM ACCESS MEMORY WITH HIGH STORAGE CAPACITY

[75] Inventors: Peter H. Voss; Leonardus C. M. G. Pfennings; Cormac M. O'Connell; Thomas J. Davies; Hans Ontrop; Cathal G. Phelan, all of Eindhoven, Netherlands

[73] Assignee: U.S. Philips Corp., New York, N.Y.

[21] Appl. No.: 265,640

[22] Filed: Nov. 1, 1988

[30] Foreign Application Priority Data

Nov. 23, 1987 [EP] European Pat. Off. ........ 87202286-8

[51] Int. Cl.⁵ .............................................. G11C 8/00
[52] U.S. Cl. ................................ 365/230.03; 365/63; 365/200; 365/230.02
[58] Field of Search ...................... 365/189.02, 230.02, 365/230.03, 200, 51, 63, 72; 371/8

[56] References Cited

U.S. PATENT DOCUMENTS

| | | | |
|---|---|---|---|
| 4,660,174 | 4/1987 | Takemae et al. | 365/63 |
| 4,675,849 | 6/1987 | Kinoshita | 365/200 |
| 4,780,852 | 10/1988 | Kajigaya et al. | 365/205 |
| 4,849,938 | 7/1989 | Furutani et al. | 365/200 |

Primary Examiner—James W. Moffitto
Attorney, Agent, or Firm—Steven R. Biren

[57] ABSTRACT

A static RAM memory is optimized for speed. The memory is divided into major memory matrices and each major memory matrix is divided into memory blocks. The memory blocks are divided in groups that per group have address bits in common, which however are per group coupled to separate pads or sets of pads. These pads are interconnected on the package to common package pins.

9 Claims, 3 Drawing Sheets

5,040,152

FAST STATIC RANDOM ACCESS MEMORY WITH HIGH STORAGE CAPACITY

BACKGROUND OF THE INVENTION

The invention relates to a fast operating static RAM memory with a high storage capacity, in particular a capacity of at least 256 k bits, wherein 1 k=1024 bits. A memory of this type has been described by Shinpei Kayano, et al, IEEE Journal of Solid State Circuits, Vol. SC-21, No. 5, October 1986, pp. 686–690. Through a metal option, the known memory may be configured as either 256 k×1 or as 64 k×4. The known memory has been optimized for low power consumption under standby conditions.

SUMMARY OF THE INVENTION

The present invention provides a memory that is optimized for speed, while relaxing the requirements for ultra-low power consumption somewhat. Now, whereas various measures have been taken on the level of the electronic circuitry that contribute to an improved operating speed, the present invention relates to such overall measures and layout that are represented in the architecture. According to one aspect of the invention, it provides a fast operating integrated circuit static RAM memory with high storage capacity having: a first plurality equal to a power of two major memory matrices, each major memory matrix comprising a second plurality of memory blocks made up of rows and columns of memory cells, characterized in that said major memory matrices are divided into groups that per group, on the integrated circuit chip the major memory matrices have predetermined address bit pads in common (A14-A17), whereas each group has these predetermined address pads separate from any other group for interconnection of any corresponding address pad externally to said chip but internally to an integrated circuit package, and wherein said predetermined address pins allow for completely receiving the block address within an associated major memory matrix. The double on-chip provision of the address lines that select the block decreases the associated delay time, in that block select predecoders may now be located more closely to the ultimate block decoders and the blocks itself.

According to a further aspect of the invention, said predetermined address pads are located on at least one side of an integrated circuit chip, and within said major memory matrices the memory blocks succeed each other in a direction transverse to said side. This allows for selecting the blocks at one side of the major memory matrix, while doing the in-block selection at the other side. Notably, said other side could be closer to the address pads for the inblock selection, while also the delay for the in-block selection could be less critical than the delay for the selection of the memory blocks themselves.

According to another aspect of the invention each major memory matrix comprises a sequence of contiguous memory blocks and each block comprises a third plurality of complete columns of the associated major memory matrix, and wherein each time a pair of major memory matrices that are contiguous in the direction of the columns share a fourth plurality of local sense amplifiers with write circuits, wherein said fourth plurality is higher than said second plurality by a factor that is a power of two. This allows for in-block selection of a plurality of columns by a circuitry that is shared between two major memory matrices. This allows for easy conversion from, e.g. a ×4 design to a ×1 design.

BRIEF DESCRIPTION OF THE DRAWINGS

The invention will be further explained with respect to the drawing, in which.

DESCRIPTION OF THE PREFERRED EMBODIMENTS

Figure 1:
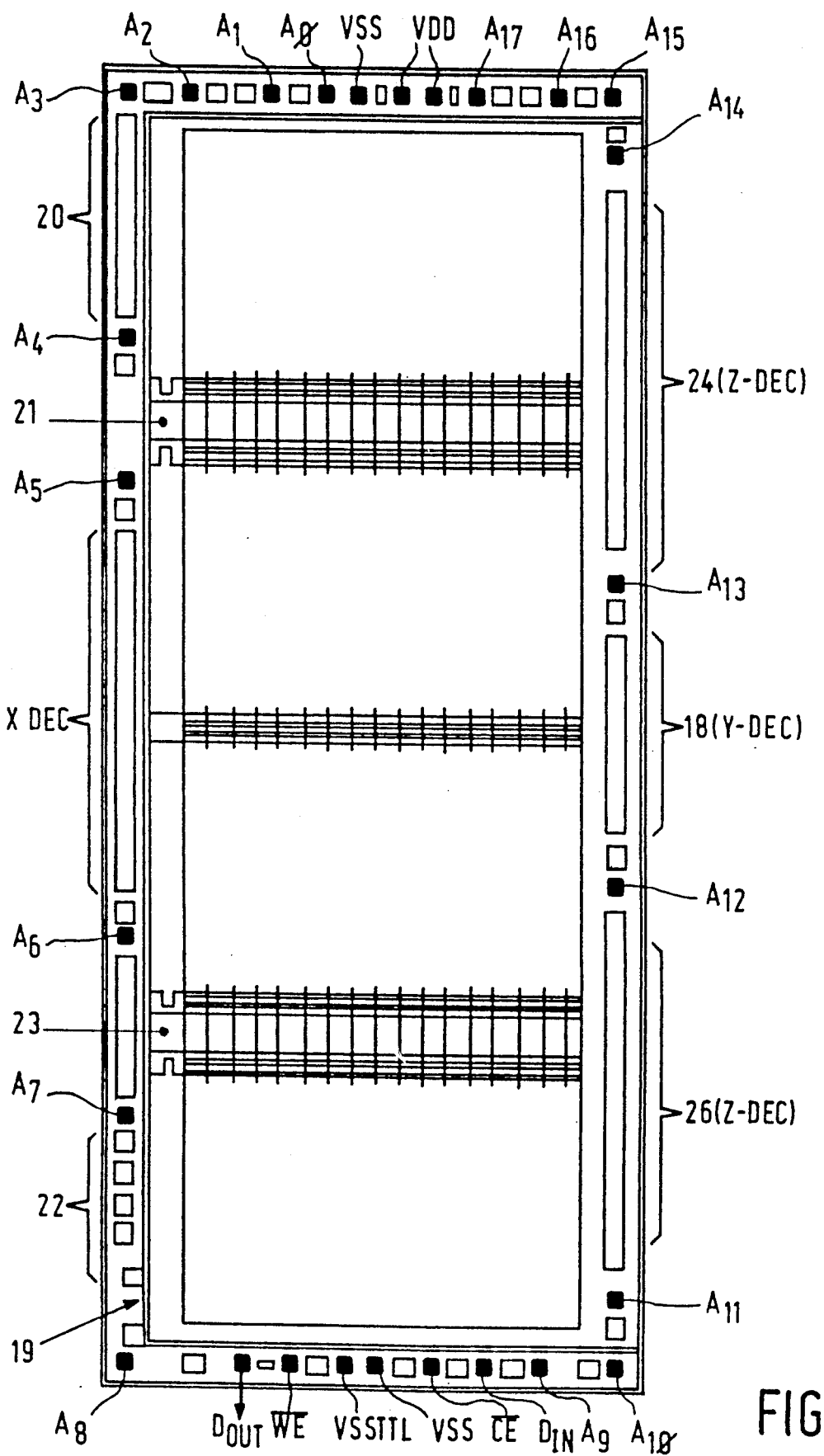
FIG. 1 is a geometrically conforming view of the integrated circuit chip.

FIG. 1 is a geometrically conforming view of the integrated circuit chip of a memory with 256 k bits capacity. The memory chip is intended for a ×1 operation in that only a single data bit would be accessible externally. However, just as the memory of the cited reference, for adaptation to a ×4 operation no architectural change would be necessary.

The memory chip of FIG. 1 has four major memory matrices, each of 64 k memory cells, each containing 128 rows by 512 columns, and also redundancy to be discussed hereinafter. The on-chip bonding pads are the following in the clock-wise sense from top left. First there are the four lowest significant address pads A3 ... A0, then a first pad for the substrate voltage Vss, then two pads for the powering voltage VDD, then the four highest significant address pads A17 ... A14, then five more address pads A13 ... A9, then data input pad DIN, then chip enable pad CE, then a second pad for the substrate voltage Vss, then a special pad for the substrate intended for the TTL-compatible circuitry on the chip VssTTL, then the write enable pad WE, then the data out pad DOUT, then the five remaining address pads A8-A4.

Each input pad for data, address or control is provided with protective circuitry against voltage surges, and each output pad is provided with driver circuitry. Row address decoders are situated at 20, 22, Y-address decoders are situated at 18, Z-address decoders are situated at 24, 26, and 1:4/4:1 multiplexing/demultiplexing circuitry for the data buses at 21, 23.

Figure 2:
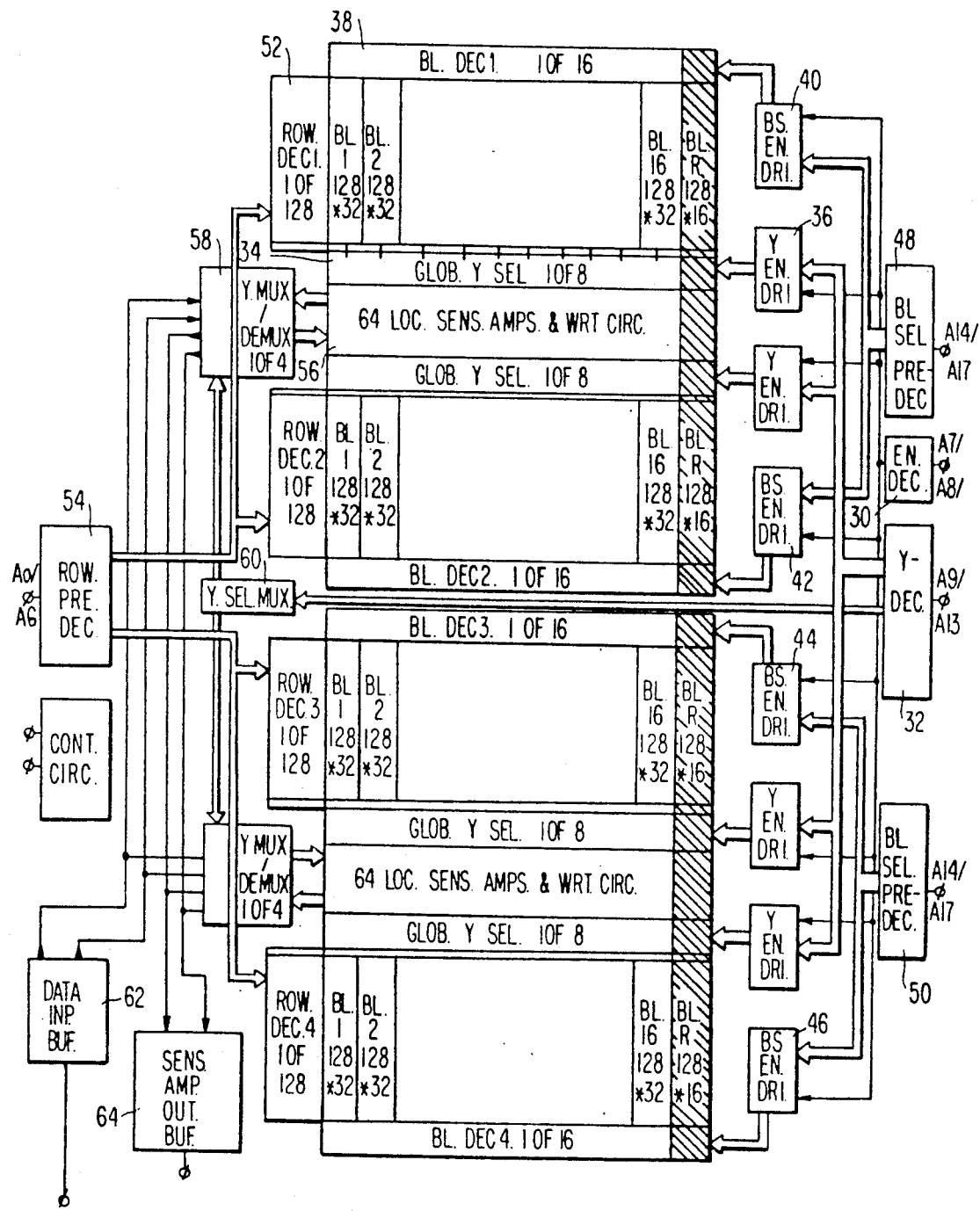
FIG. 2 is a block diagram of the logic representation of the memory.

FIG. 2 is a block diagram of the logic representation of the memory. All major memory matrices have been shown and within each major memory matrix the first two non-redundant blocks, the last non-redundant block and a redundant half-block (hatched). Each block comprises 32 full columns of 128 rows with one operative redundant row provided. Activation of the redundancy is conventionally effected by fuses. In fact, for layout reasons a second redundant row has been added but this latter row is non-accessible under all conditions.

The major memory matrices are arranged in a single file of four. Due to the fact that the height/width ratio of the memory cells is about equal to three (5 by 14 microns), the memory chip fits into a 300 mil DIL plastic package.

Figure 3:
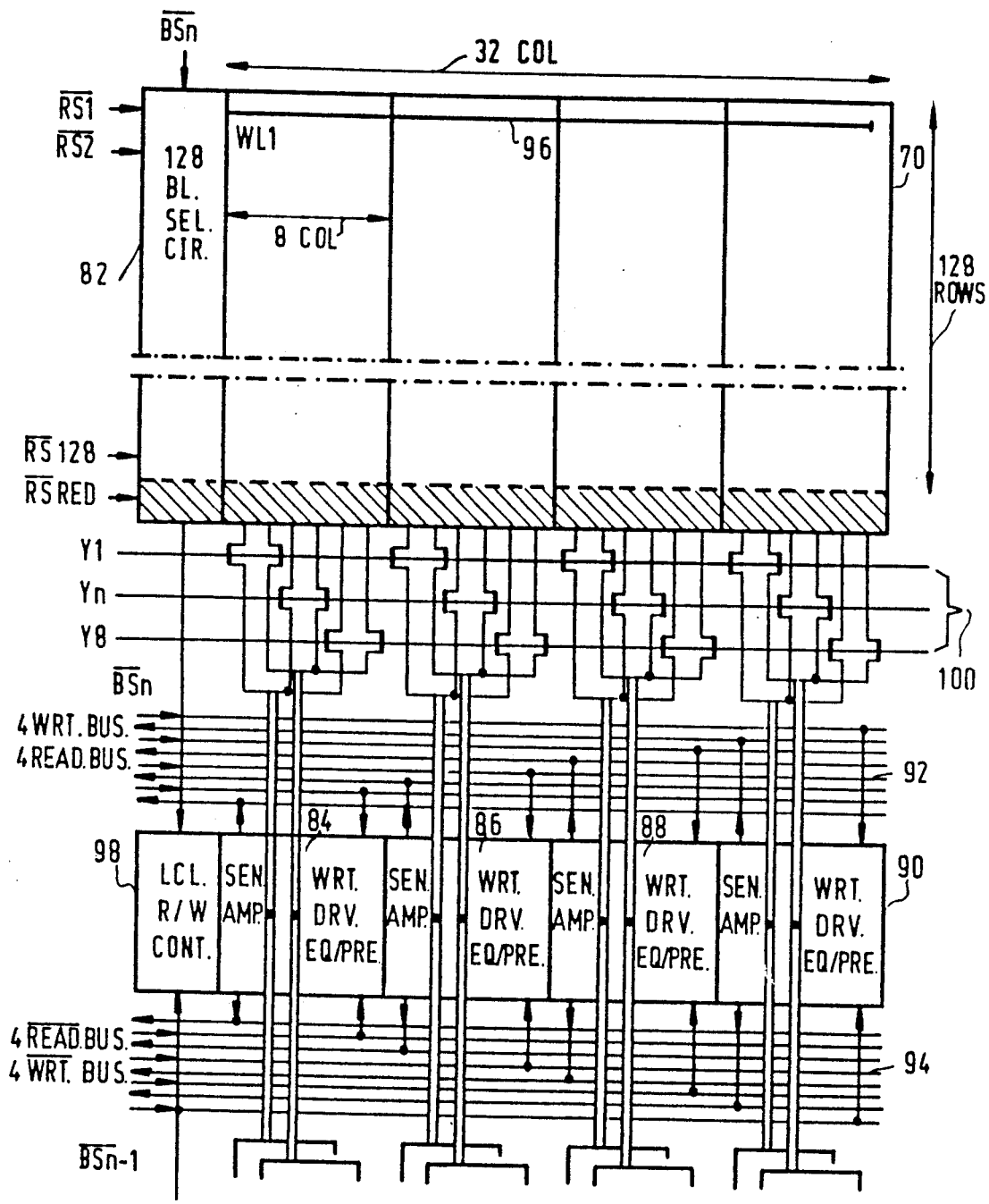
FIG. 3 is a block diagram of the access to a single block.

The addressing is as follows. The memory addressing is based on address transition detection for lowering power consumption. Prior to addressing proper, an equalization pulse presets all bit lines to an identical safe voltage, by shorting them together, for example, at 3 volts. The major memory matrices are addressable by address bits A7, A8 that are decoded in decoder 30. For lowering the required equalization pulse, the matrices were split into memory blocks, whereas for each access operation within each block only four columns are activated; the others are kept in the precharge state. The selection of the appropriate four columns is done by address bits A11, A12, A13, that are decoded in Y-decoders 32. The associated global selection is effected in selector 34. Selection within the block is shown in FIG. 3 (address bits A9, A10, also decoded in Y-decoder 32). Driving of selector 34 is effected in Y-enable driver 36 under activation by decoder 30. Selection of a particular block is effected in block decoder 38 under activation from block select enable driver 40. The latter is activated by enable decoder 30. Drivers 40, 42 receive predecoded address bits A14-A17 from block select predecoder 48. The arrangement of blocks 40, 42, 48 is duplicated in blocks 44, 46, 50 that are also receiving address bits A14-A17. The two predecoders 48, 50 are each fed by four associated on-chip address bit pads which allows for faster access in that the bit lines between predecoders 48, 50 and the associated block decoders are now shorter than if there had been only a single block select predecoder. Double provision of Y-address bits A9-A13 is less pressing in that the capacitance of the load for the Y-decoders is less. In the memory block, block select circuit or row decoder 52 enables one of the 128 local word lines under control of address bits A0-A6 that are predecoded in row predecoder 54. For the purpose of a fast address access the number of cells per column is minimized. The redundancy is unique to each matrix; note that the decoding circuitry that relates to redundant cells also has been hatched. The X-decoder allows also access to the redundant rows provided with access that is made activatable by fuse-blowing. The blocks 56, 58, 60 will be explained with respect to FIG. 3. This also applies to data bufferings 62, 64.

FIG. 3 is a block diagram of the access to a single memory block. As shown, block 70 contains four fractional blocks of 8 full-height columns each. At left, a part of block select circuitry 82 has been shown, that is activatable by any of row select signals RS1, RS2 ... RS128, RSRED as produced by row decoder 52 of FIG. 2. The inverted signal values are activating. Furthermore, the block select circuit 82 receives block select signal BSn (inverted value is activating) from block decoder 38 in FIG. 2. As shown, the word lines, as exemplified by word line WL1 (96), start from block select circuitry 82, but terminate at the end of the block in question.

For access of the cells, the logic in this local block area is constructed as a ×4 configuration and only at the left edge of the matrices does it become a ×1 set-up. Two contiguous major memory matrices together share local sense amplifiers and local write drivers inclusive of equalizer control and precharge 84, 86, 88, 90, and also local read/write control block 98. As shown, they are connected to four associated READ buses and four associate WRITE buses, both in inverted and in non-inverted form. Area 100 contains for each fractional block 8 parallel transfer gates that are controlled by Y-select signals from Y-enable driver 36 in FIG. 2; only three such gates were shown per fractional block. Thus, the multiplicity of blocks 84, ... in block 56 of FIG. 2 is 4×16=64. Block 56 is twice present on the chip. In addition to blocks 84, ... a local read/write control block 98 has been provided in block 56, which is furthermore controlled by the inverted signal BSn, that is through connected via block select circuitry. Furthermore, inasmuch as the central blocks and the buses are shared among two neighboring major memory matrices, control block 98 also receives signal BSn-1 from the lower matrix (the indices n, n-1 are symbolic).

Back in FIG. 2, block 58 provides for multiplexing-/demultiplexing between the fourfold bit-level access on buses 92, 94 on the one hand and data input buffer 62 and sense amplifier output buffer 64 in the other. The control for element 58 is provided by Y-multiplex selector 60 that is controlled by Y-decoder 32, Elements 62, 64 also provide interfacing between internal complementary signal pairs and external single-level signals on pads DIN and DOUT.

The provision of Vss power interconnect is done by placing two pads on top and bottom of the chip as shown in FIG. 1. The top Vss pad uses a down bond onto the conductive backplane of the package. The bottom Vss pad is also down-bonded to the backplane. From the package pin a separate lead is bonded to the back plane. This double provision of Vss lowers impedance.

A package via directly couples to the backplane. For low noise, a bond wire is used to connect a separate Vss pad especially for referencing TTL levels for the input stages of the address buffers. This results in that non-accessed address lines would not pick up the noise which could lead to a pseudo address change that would for such address lines trigger a spurious access operation. The VDD pin of the package is connected to the chip onto two parallel pads.

If a ×4 architecture were required, the element 58 would be bypassed and by provision of fourfold in/out buffers 62/64 and associated bond pads, interfacing to DIL package were straightforward. For further increased storage capacity various of the above provisions could be multiplicated to a necessary degree.

What is claimed is:

1. A fast-operating integrated circuit static RAM memory with high storage capacity comprising a first plurality equal to a power of two major memory matrices, each major memory matrix comprising a second plurality of memory blocks made up of rows and columns of memory cells, characterized in that said major memory matrices are divided into groups on the integrated circuit, the major memory matrices having predetermined address bit connection pads in common, each of said groups having predetermined address pads separate from those of any other group for interconnection of any corresponding address pad externally to said chip but internally to an integrated circuit package, and said predetermined address pads comprising means for completely receiving the block address within an associated major memory matrix.

2. A memory as claimed in claim 1, wherein said predetermined address pads are located on at least one side edge of an integrated circuit chip, and within said major memory matrices the memory blocks succeed each other in a direction transverse to said side edge.

3. A memory as claimed in claim 1 or 2, wherein each major memory matrix comprises a sequence of contiguous memory blocks and each block comprises a third plurality of complete columns of the associated major memory matrix, wherein a pair of major memory matrices that are contiguous in the direction of the columns share a fourth plurality of local sense amplifiers with write circuits, and wherein said fourth plurality is higher than said second plurality by a factor that is a power of two.

4. A memory as claimed in claim 1 or 2, wherein each major memory matrix comprises a sequence of contiguous memory blocks and each block comprises a third plurality of complete columns of the associated major memory matrix, and wherein a pair of major memory matrices that are contiguous in the direction of the columns on their mutually facing sides are provided with global selection means for selecting a series of corresponding columns in each block of the associated pair of major memory matrices.

5. A memory as claimed in claim 1 or 2, wherein said major memory matrices are arranged in a single file in the direction of the columns.

6. A memory as claimed in claim 1 or 2, wherein each major memory matrix is provided with redundant columns that represent a predetermined fraction of a replaceable memory block.

7. A memory as claimed in claim 6, wherein said fraction is one-half.

8. A memory as claimed in claim 6, wherein said fraction is dividible into sub-fractions, for each allowing replacement of a corresponding sub-fraction of a memory block.

9. A memory as claimed in claim 1 or 2, wherein said memory is provided with a fifth plurality of $V_{ss}$ bond pads on chip that are down-bonded to a conductive plate that is connected to an external pin of an encapsulating package, there also being provided a special $V_{ss}$ bond pad for connecting to address buffers of said memory, wherein said special $V_{ss}$ bond pad is un-bonded from said conductive plate but is on-package connected to said external pin.

* * * * *